US006582481B1

(12) United States Patent
Erbil

(10) Patent No.: US 6,582,481 B1
(45) Date of Patent: Jun. 24, 2003

(54) METHOD OF PRODUCING LITHIUM BASE CATHODES

(75) Inventor: Ahmet Erbil, Atlanta, GA (US)

(73) Assignee: Johnson Research & Development Company, Inc., Smyrna, GA (US)

( * ) Notice: Subject to any disclaimer, the term of this patent is extended or adjusted under 35 U.S.C. 154(b) by 0 days.

(21) Appl. No.: 09/447,250

(22) Filed: Nov. 23, 1999

(51) Int. Cl.[7] ............................. H01M 6/00; C23C 16/00
(52) U.S. Cl. ................. 29/623.5; 29/623.1; 427/372.2; 427/255.23
(58) Field of Search .................. 429/231.9, 231.95, 429/231.1, 162, 133, 137; 29/623.1, 623.5; 427/255.19, 255.23, 255.395, 250, 252, 372.2

(56) References Cited

U.S. PATENT DOCUMENTS

| | | | |
|---|---|---|---|
| 3,237,078 A | 2/1966 | Mallory | 320/17 |
| 3,393,355 A | 7/1968 | Whoriskey et al. | 320/18 |
| RE28,456 E * | 7/1975 | Langer et al. | 260/583 |
| 4,303,877 A | 12/1981 | Meinhold | 320/18 |
| 4,614,905 A | 9/1986 | Petersson et al. | 320/18 |
| 4,654,281 A | 3/1987 | Anderman et al. | 429/209 |
| 4,719,401 A | 1/1988 | Altmejd | 320/13 |
| 5,110,696 A * | 5/1992 | Shokoohi et al. | 429/218 |
| 5,270,635 A | 12/1993 | Hoffman et al. | 320/21 |
| 5,291,116 A | 3/1994 | Feldstein | 320/4 |
| 5,314,765 A | 5/1994 | Bates | 429/194 |
| 5,336,573 A | 8/1994 | Zuckerbrod et al. | 429/252 |
| 5,338,625 A | 8/1994 | Bates et al. | 429/193 |
| 5,362,581 A | 11/1994 | Chang et al. | 429/249 |
| 5,387,857 A | 2/1995 | Honda et al. | 320/18 |
| 5,445,906 A | 8/1995 | Hobson et al. | 429/162 |
| 5,455,126 A | 10/1995 | Bates et al. | 429/127 |
| 5,512,147 A | 4/1996 | Bates et al. | 204/192.15 |
| 5,561,004 A | 10/1996 | Bates et al. | 429/162 |
| 5,567,210 A | 10/1996 | Bates et al. | 29/623.5 |
| 5,569,520 A * | 10/1996 | Bates | 429/162 |
| 5,597,660 A | 1/1997 | Bates et al. | 429/191 |
| 5,612,152 A | 3/1997 | Bates | 429/152 |
| 5,654,084 A | 8/1997 | Egert | 428/215 |
| 5,778,515 A | 7/1998 | Menon | 28/623.4 |
| 5,783,928 A | 7/1998 | Okamura | 320/122 |
| 5,811,205 A | 9/1998 | Andrieu et al. | 429/137 |
| 5,821,733 A | 10/1998 | Turnbull | 320/116 |
| 5,874,379 A * | 2/1999 | Joo et al. | 501/138 |

OTHER PUBLICATIONS

Journal of Power Sources, P. Fragnaud, R. Nagarajan, D.M. Schleich, D. Vujic, Thin–film cathodes for secondary lithium batteries, 1995 Not Month Available.

Materials Research Society, The Preparation and Characterization of Lithium Cobalt Oxide Thin Films by LPCVD, 1996 Not Available Month.

Journal of Power Sources, Thin film electrolytes and electrodes for rechargeable lithium–ion batteries, J. Schoonman, E.M. Kelder, 1997 Not Available Month.

Solid State Ionics, Fabrication of LiCoO2 thin film cathodes for rechargeable lithium battery by electrostatic spray pyrolysis, C.H. Chen et al., 1995.

Journal of Materials Science, Unique porous LiCoO2 thin layers prepared by electrostatic spray deposition. C.H. Chen et al., 1996 Not Available Month.

* cited by examiner

*Primary Examiner*—Patrick Ryan
*Assistant Examiner*—R Alejandro
(74) *Attorney, Agent, or Firm*—Baker, Donelson, Bearman & Caldwell

(57) ABSTRACT

A method of producing a layer of lithiated material is provided wherein a mixture of Li (TMHD) and Co (acac)$_3$ is dissolved in an organic solvent comprising diglyme, toluene and HTMHD to produce a solution. The solution is deposited upon a substrate by atomizing the solution, passing the atomized solution through a heating zone so as to vaporize the solution, and directing the vaporized solution onto a substrate.

23 Claims, 11 Drawing Sheets

METHOD OF PRODUCING LITHIUM BASE CATHODES

TECHNICAL FIELD

This invention relates generally to thin film batteries, and more particularly to the production of lithium cathodes of thin film, rechargeable lithium ion batteries.

BACKGROUND OF THE INVENTION

Conventional, canister type batteries today include toxic materials such as cadmium, mercury, lead and acid electrolytes. These chemicals are presently facing governmental regulations or bans as manufacturing materials, thus limiting their use as battery components. Another problem associated with these battery materials is that the amount of energy stored and delivered by these batteries is directly related to the size and weight of the active components used therein. Large batteries, such as those found in automobiles, produce large amounts of current but have very low energy densities (Watts hours per liter) and specific energies (Watt hours per gram). As such, they require lengthy recharge times which render them impractical for many uses.

To address the need for higher energy densities and specific energies, the battery industry has been moving towards lithium based batteries. The major focus of the battery industry has been on liquid and polymer electrolyte systems. However, these systems have inherent safety problems because of the volatile nature of the electrolyte solvents. Furthermore, these types of batteries have a relatively high ratio of inert material components, such as the current collector, separator, and substrate, relative to the active energy storage materials used for the anode and cathode. In addition, their relatively high internal impedance results in low rate capability (watts/kilogram) which renders them impractical for many applications.

Thin film lithium batteries have been produced which have a stacked configuration of films commencing with an inert ceramic substrate upon which a cathode current collector and cathode are mounted. A solid state electrolyte is deposited upon the cathode, an anode in turn deposited upon the electrolyte, and an anode current collector mounted upon the anode. Typically, a protective coating is applied over the entire cell. Lithium batteries of this type are describe in detail in U.S. Pat. Nos. 5,569,520 and 5,597,660, the disclosures of which are specifically incorporated herein. However, the lithiated cathode material of these batteries have a (003) alignment of the lithium cells, as shown in FIG. 1, which creates a high internal cell resistance resulting in large capacity losses.

Thin film batteries have also been produced by forming active cathode materials through chemical vapor deposition techniques. In the past, chemical vapor deposition cathodes have been manufactured in extremely low pressure environments, within a range of 1-100 torr. The requirements of this extremely low pressure environment greatly increases the cost of production and greatly reduces the feasibility of producing commercially viable products as a result of the difficulty in controlling such. Furthermore, this type of chemical vapor deposition is typically carried out by heating a precursor solution to cause evaporation of the solution to a gas phase so that it may be carried off to a deposition location through a stream of non-reactive gas, such as argon. The heating of the precursor for an extended time period can cause the solution to decompose and therefor become unworkable. Furthermore, the high temperature and low pressure of the system requires extensive heating of the transport lines conveying the solution to prevent the evaporated solution from condensing between the heating location and the deposition location, thus further increasing the cost and the complications involved in production. Lastly, heretofore the solutions utilized in chemical vapor deposition of lithiated material were highly reactive and sensitive to air, hence the need for the argon gas environment. The resulting product was also amorphous and inhomogeneous thereby greatly restricting its use in thin film battery applications.

Recently, it has been discovered that the annealing of lithiated cathode materials on a substrate under proper conditions results in batteries having significantly enhanced performances, for the annealing causes the lithiated material to crystalize. This crystallized material has a hexagonal layered structure in which alternating planes containing Li and Co ions are separated by close packed oxygen layers. It has been discovered that $LiCoO_2$ films deposited onto an alumina substrate by magnetron sputtering and crystallized by annealing at 700° C. exhibit a high degree of preferred orientation or texturing with the layers of the oxygen, cobalt and lithium oriented generally normal to the substrate, as illustrated by the (101) plane shown in FIG. 2. This orientation is preferred as it provides for high lithium ion diffusion through the cathode since the lithium planes are aligned parallel to the direction of current flow. It is believed that the preferred orientation is formed because the extreme heating during annealing creates a large volume strain energy oriented generally parallel to the underlying rigid substrate surface. As the crystals form they naturally grow in the direction of the least energy strain, as such the annealing process and its resulting volume strain energy promotes crystal growth in a direction generally normal to the underlying substrate surface, which also is the preferred orientation for ion diffusion through the crystal.

In the past, with an annealing temperature below 600° C. the lithium material has no significant change in the microstructure, and thus the lithium orientation remains amorphous, as taught in Characterization of Thin-Film Rechargeable Lithium Batteries With Lithium Cobalt Oxide Cathodes, in the Journal of The Electrochemical Society, Vol. 143, No 10, by B.Wang, J. B. Bates, F. X. Hart, B. C. Sales, R. A. Zuhr and J. D. Robertson. This amorphous state restricts lithium ion diffusion through the layers of oxygen and cobalt, and therefore creates a high internal cell resistance resulting in large capacity losses.

Hence, in order to anneal the lithiated cathode material to the most efficient orientation it was believed that the cathode had to be bonded to a rigid substrate and heated to nearly 700° C. for an extended period of time.

It thus is seen that a need remains for a method of producing a cathode for use in high performance rechargeable, thin film lithium battery without the need for an extemely low pressure system and without annealing the cathode. Accordingly, it is to the provision of such that the present invention is primarily directed.

SUMMARY OF THE INVENTION

In a preferred form of the invention, a method of producing a layer of $LiCoO_2$ comprises the steps of providing a solution having a mixture of Li(TMHD) and Co(acac)$_3$ dissolved in an organic solvent, processing the solution to form a mist, heating the solution mist to a vapor state, and depositing the vapor on a substrate.

DETAILED DESCRIPTION

Figure 2:
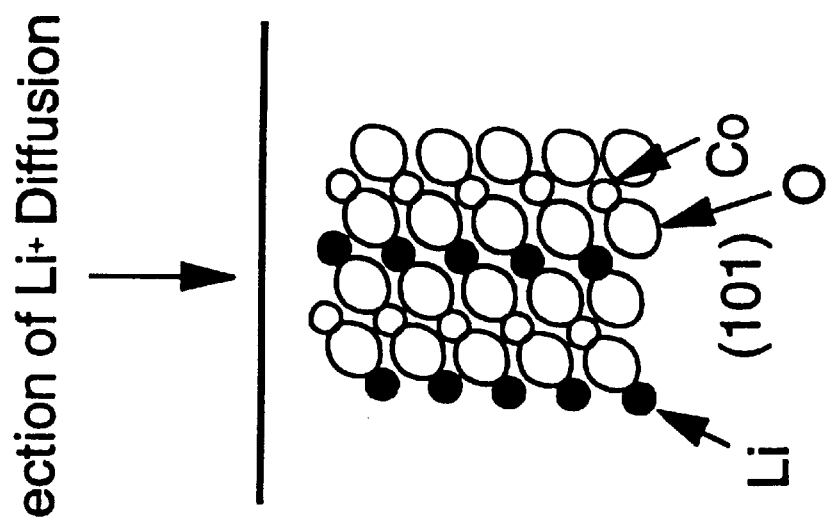
FIG. 2 is an illustration of a lithium intercalation compound oriented along the preferred (101) plane.
Figure 1:
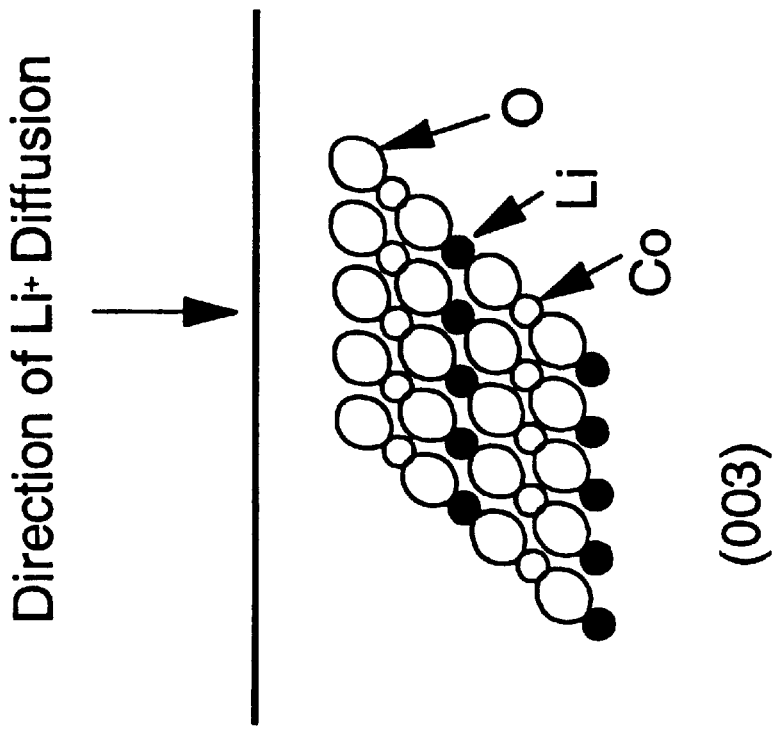
FIG. 1 is an illustration of a lithium intercalation compound oriented along the (003) plane.
Figure 4:
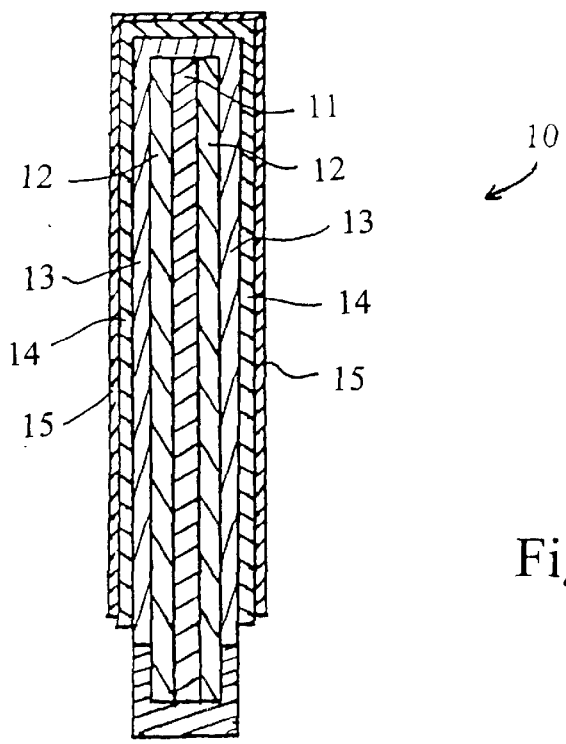
FIG. 4 is a cross-sectional view of the thin film lithium battery of FIG. 3 taken along plane 4—4.
Figure 3:
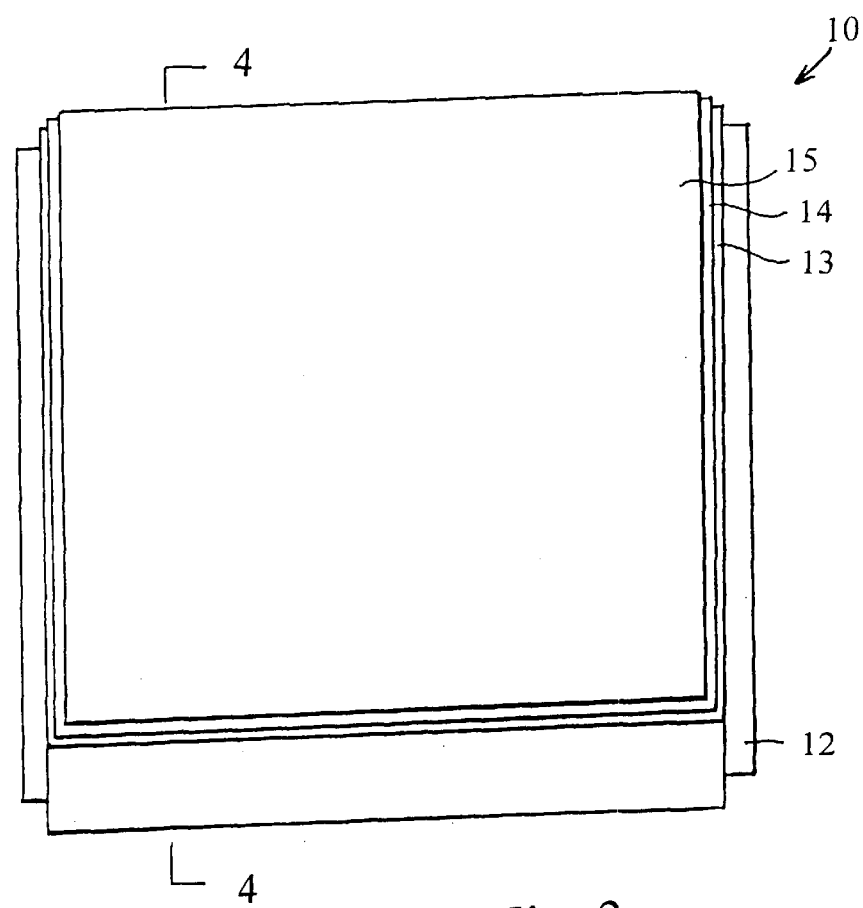
FIG. 3 is a plan view of a thin film lithium battery illustrating principles of the invention in a preferred embodiment.

With reference next to the drawings, there is shown a rechargeable, thin film lithium battery cell 10 produced in accordance with a method embodying principles of the invention in a preferred form. The battery cell 10 has an aluminum cathode current collector 11 sandwiched between two cathodes 12. The cathodes 12 are made of a lithium intercalation compound, or lithium metal oxide, such as $LiCoO_2$, $LiMgO_2$, $LiNiO_2$ or $LiFeO_2$. Each cathode 12 has a solid state electrolyte 13 formed thereon. The electrolyte 13 is preferably made of lithium phosphorus oxynitride, $Li_xPO_yN_z$. In turn, each electrolyte 13 has an anode 14 deposited thereon. The anode 14 is preferably made of silicon-tin oxynitride, SiTON, when used in lithium ion batteries, or other suitable materials such as lithium metal, zinc nitride or tin nitride. Finally, an anode current collector 15, preferably made of copper or nickel, contacts both anodes 14 to substantially encase the cathode collector 11, cathode 12, electrolyte 13 and anode 14.

Figure 5:
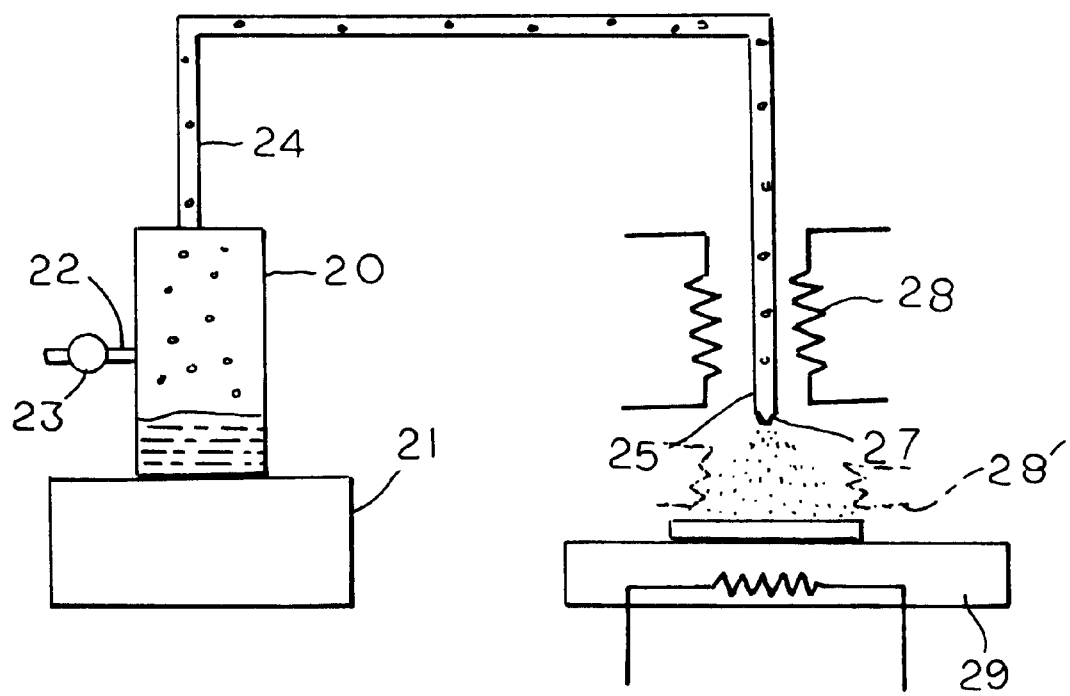
FIG. 5 is a schematic diagram of the apparatus utilized to deposit the cathode of the thin film lithium battery of FIG. 3.

The inventive method will utilize a vapor deposition apparatus shown in FIG. 5. The apparatus includes a holding tank 20 coupled to an ultrasonic generator 21. The holding tank 20 has an air inlet 22 coupled to an air pump 23 and an outlet conduit 24 extending to an injection tube 25 having a nozzle 27 at one end. The injection tube 25 is coupled to a heating element 28. The nozzle 27 is directed towards a heater block 29 positioned adjacent the nozzle 27.

The battery cell 10 is preferably manufactured in the following manner. A mixture of Li(TMHD), commonly referred to as lithium (2,2,6,6-tetramethyl-3,5-heptadionate or $Li(C_{11}H_{19}O_2)$) and commonly referred to as cobalt (III) acety lacetonate $Co(C_5H_7O_2)_3$ or $Co(acac)_3$ is dissolved in an organic solvent, such as a mixture of diglyme, toluene and HTMHD, to produce a solution which is held within holding tank 20. The ultrasonic generator 21, or any other type of conventional atomizer, creates a stream of solution mist, having a liquid droplet size distribution of between 5 to 20 micrometers with a preferred droplet size of approximately 5 micrometers. The mist droplets are carried through the outlet conduit 24 to the injection tube 25 due to the force of the pressurized air from air pump 23 introduced into the holding tank through air inlet 22, the air inlet airstream is pressurized to between 1–2 p.s.i.

The injection tube 25 is heated to approximately 200° C. so that the mist droplets passing therethrough are vaporized. This vapor is then directed onto a substrate positioned approximately 1.5 to 2 inches from the end of nozzle. The substrate is heated by the underlying heating block 29 to approximately 400° C. As the vapor approaches and contacts the heated substrate the Li (TMHD) and $Co(acac)_3$ reacts with the $O_2$ within the ambient air resulting in the formation of a layer of $LiCoO_2$ on the substrate surface and the production of volatile organic gases which are vented away. It has been discovered that the resulting layer $LiCoO_2$ forms as crystals having a preferred orientation along the (101) plane, as shown in FIG. 2. The substrate may then be inverted in order to deposit a layer upon its opposite side.

The following example is given for illustrative purposes only and is not meant to be a limitation on the subject invention.

A solution was prepared by mixing 0.25 grams parts Li (TMHD) and 0.5 grams of Co $(acac)_3$ in an organic solvent comprising a mixture of diglyme, toluene and HTMHD having a volume of 53 ml. The mixture contained 40 ml of diglyme, 10 ml toluene and 3 ml of HTMHD. This solution provides a critical advantage as it is capable of being handled in air without any adverse effects. The misted solution was passed through a ¼ inch ID outlet conduit 24 at a rate of 2 liters per minute and through an approximately 2 inch long injection tube heated to 200° C. in order to achieve complete vaporization of the mist. The resulting vapor was directed onto a $SiO_2$ substrate positioned approximately 1.5 inches from the nozzle 27.

The resulting layer of $LiCoO_2$ appeared to have three concentric, distinct regions: a central first region R1 having a dark green, shiny appearance, a second region R2 surrounding the first region R1 having a dark green appearance, and a third region R3 surrounding the second region R2 having a light green appearance. It is believed that this non-uniformity is due to the injection scheme utilized in the experiment.

Figure 6:
FIG. 6 is a photocopy of a photograph showing the first region of the cathode layer deposited in accordance with the method of the preferred embodiment.
Figure 7:
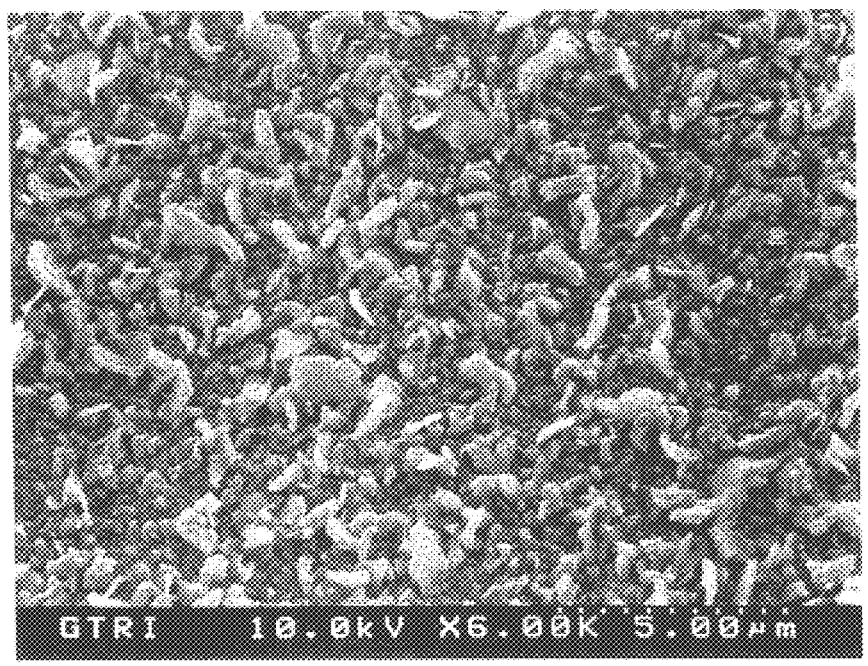
FIG. 7 is a photocopy of a photograph showing the second region of the cathode layer deposited in accordance with the method of the preferred embodiment.
Figure 8:
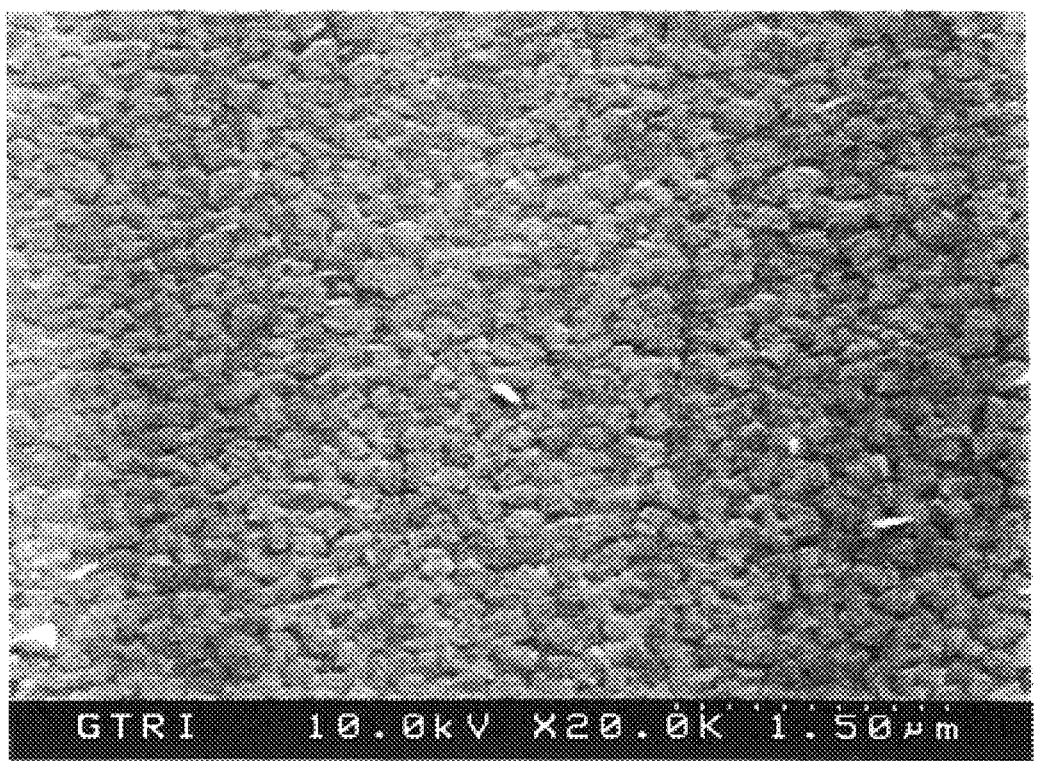
FIG. 8 is a photocopy of a photograph showing the third region of the cathode layer deposited in accordance with the method of the preferred embodiment.

Referring next to FIGS. 6–8, there are shown SEM photographs of the first, second and third regions, respectively. FIGS. 6 and 8 show that the first and third regions of the layer to be extremely smooth with very uniform grain sizes of approximately 100 nm. This smoothness and grain size provides an exceptional cathode structure not previously achieved with conventional vapor deposition methods. The layer exhibited no evidence of cracking or peeling.

Figure 12:
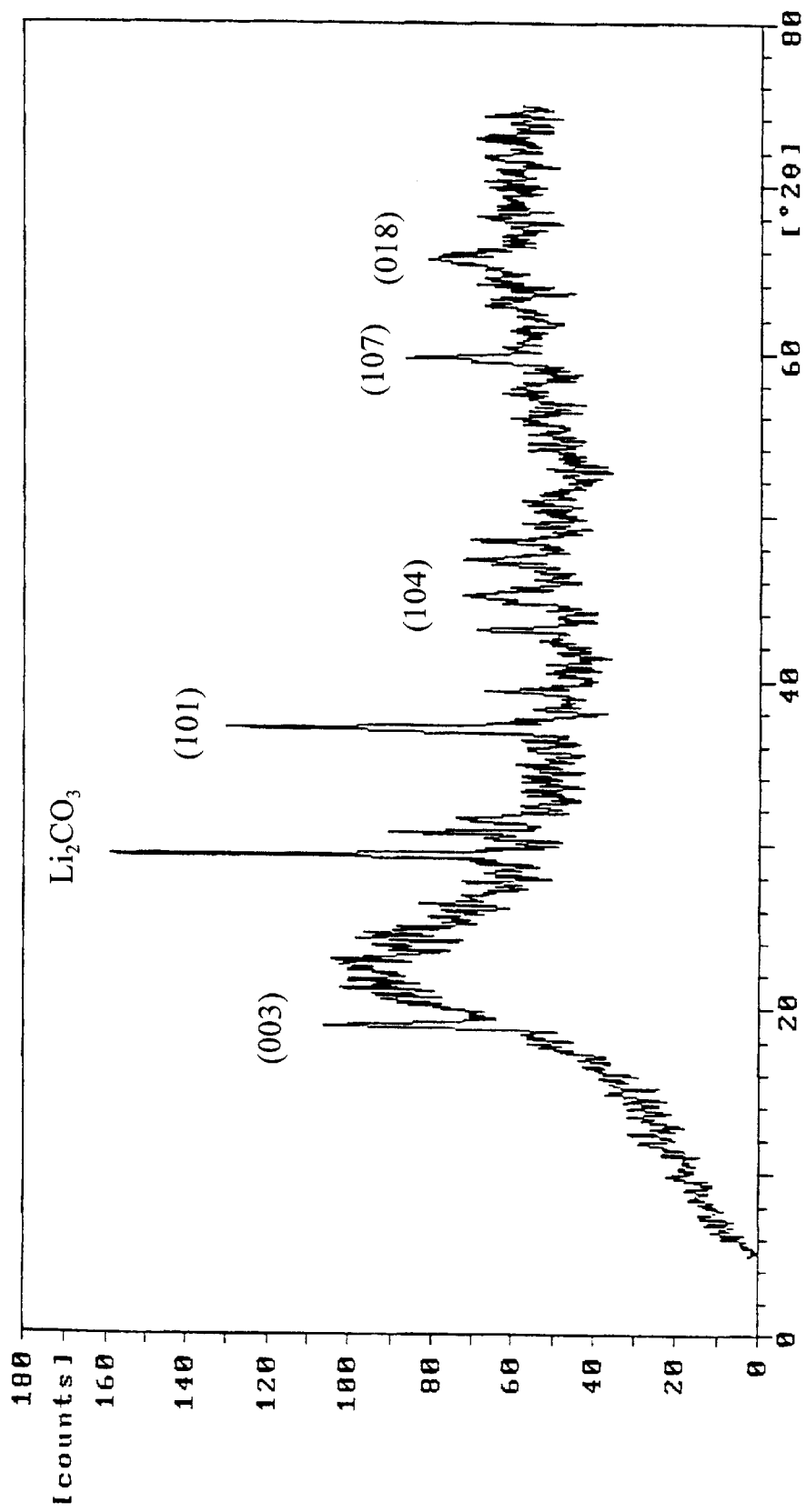
FIG. 12 is a graph of an x-ray diffraction pattern of a cathode layer deposited in accordance with the method of the preferred embodiment.

As shown in FIG. 12, an x-ray diffraction pattern of all three regions shows a high degree of texturing in the (101) plane. It should be noted that the peaks associated with the $LiCoO_2$ phase are sharp which indicates that this phase has good crystallinity. This also shows a broad peak at approximately 22° which is assumed to be associated with the amorphous $SiO_2$ substrate.

Figure 9:
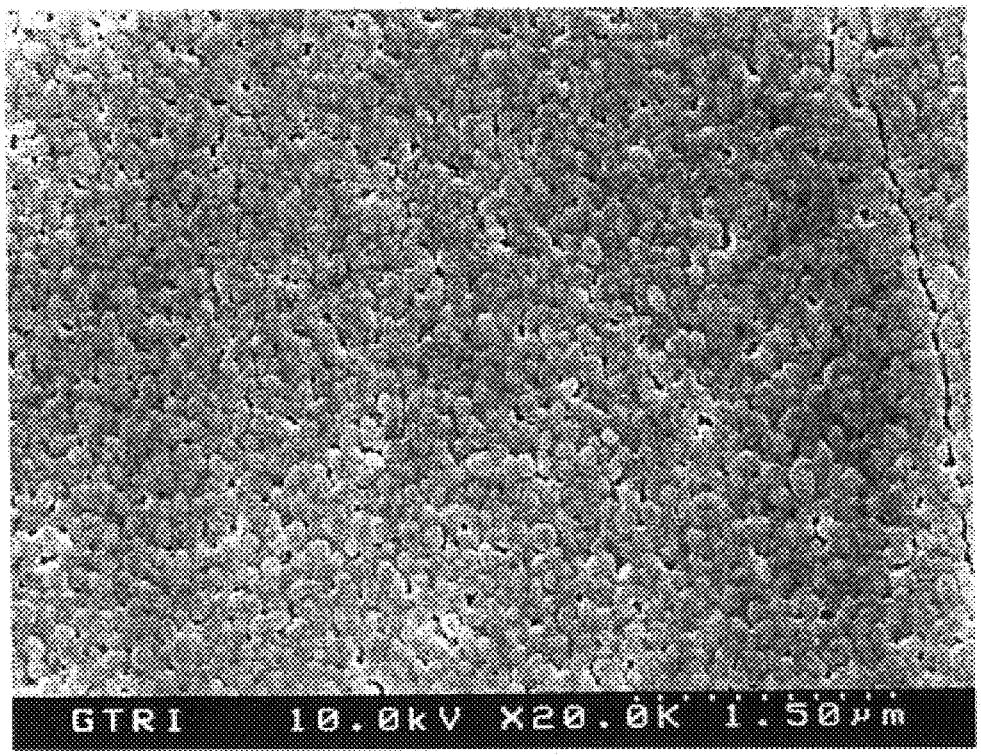
FIG. 9 is a photocopy of a photograph showing the first region of the cathode layer deposited in accordance with the method of the preferred embodiment after being annealed.
Figure 10:
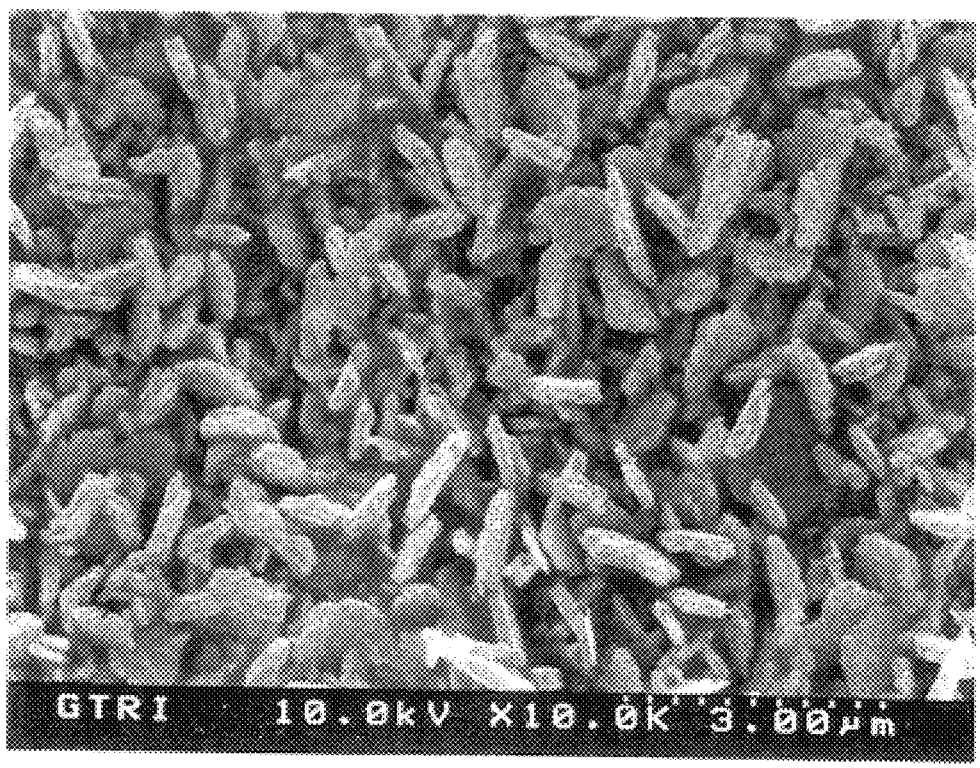
FIG. 10 is a photocopy of a photograph showing the second region of the cathode layer deposited in accordance with the method of the preferred embodiment after being annealed.
Figure 11:
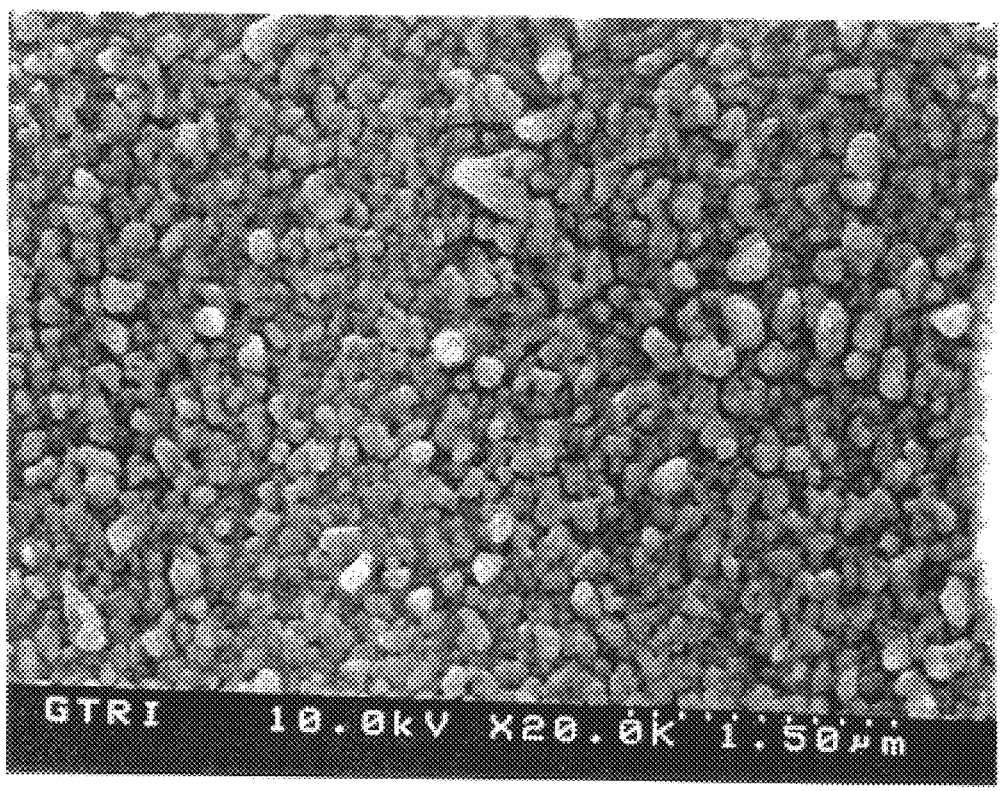
FIG. 11 is a photocopy of a photograph showing the third region of the cathode layer deposited in accordance with the method of the preferred embodiment after being annealed.
Figure 13:
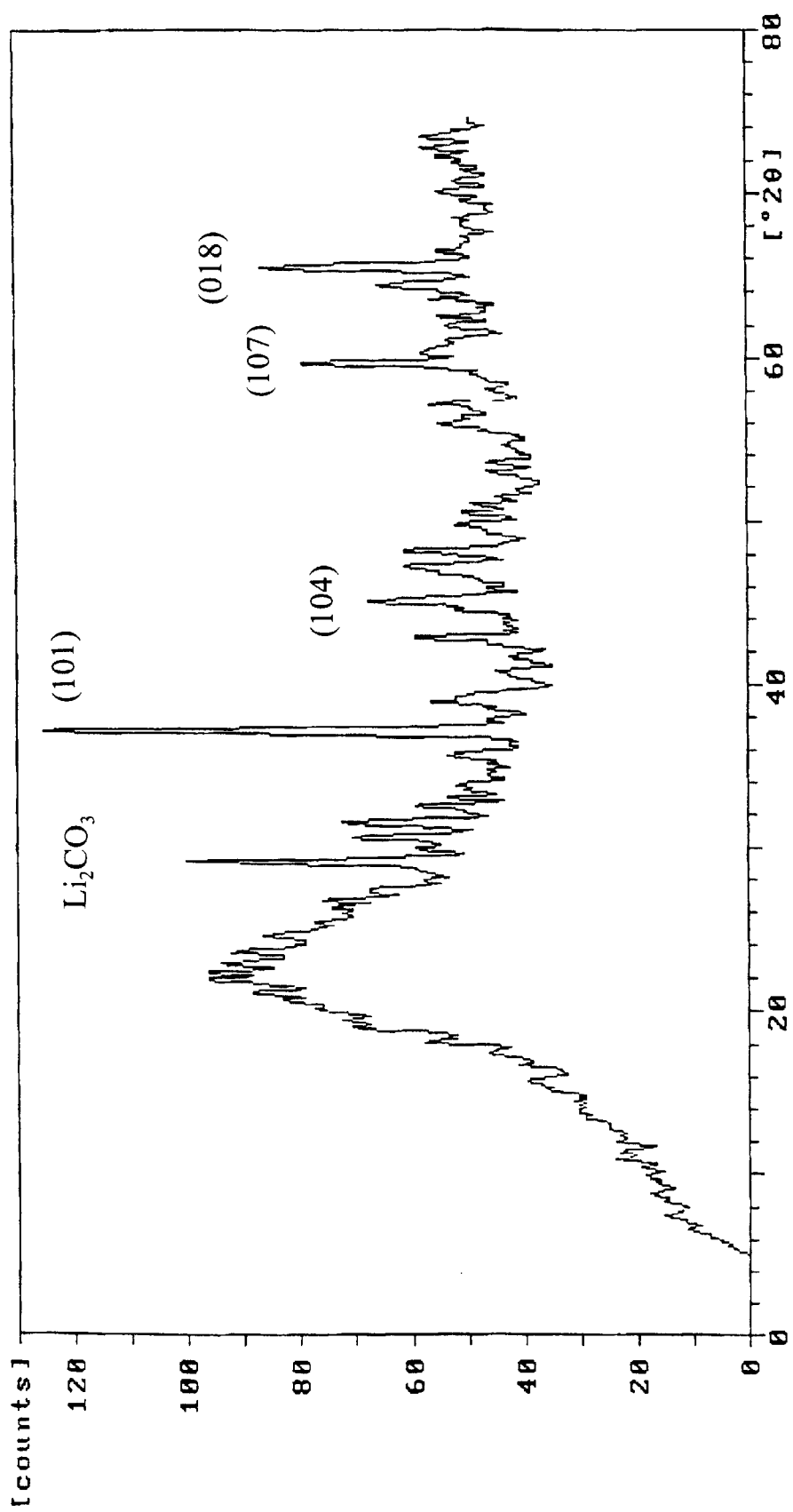
FIG. 13 is a graph of an x-ray diffraction pattern of a cathode layer deposited in accordance with the method of the preferred embodiment after being annealed.

The sample layer of LiCoO$_2$ was then annealed at 650° C. for a period of 30 minutes. A comparison of the pre-annealed sample to the post-annealed sample showed little differences. FIGS. 9–11 show the first, second and third regions, respectively, of the post-annealed sample. It should be noted that the crystalline structure within the (101) plane remained very similar as shown by the comparison of FIG. 12 with FIG. 13. As such, the annealing process did not provide significant benefits to the cathode layer.

Of particular importance is that fact that after the annealing process a crack appeared in the sample, as shown on the extreme right side of FIG. 9. This type of cracking of the cathode material is a problem applicant is attempting to avoid as this will cause a degradation of the cathode which may result in the ineffectiveness of the battery.

Hence, it should be understood that the present invention results in the formation of a LiCoO$_2$ layer with the proper (101) plane crystalline growth. Moreover, this process achieves this result without the need of annealing the LiCoO$_2$ layer to achieve the proper (101) plane crystalline growth. Lastly, this was achieved utilizing chemical vapor deposition in ambient conditions.

Once the cathode layer is complete the remaining portions of the battery, such as the electrolyte 13, anode 14, anode collector 16 may be applied. The electrolyte and anode may be applied through any conventional means, such as by sputtering, chemical vapor deposition, spray pyrolysis, laser ablation, ion beam evaporation or the like.

It should be understood that the length of the injection tube 25, flow rate through the injection tube and heating of the injection tube are all variables that must be adjusted in order to achieve the proper vaporization of the mist droplets passing through the injection tube, i.e. the heat input must be matched to the boiling point of the solvent. The injection tube may be heated by any convention means, such as with microwave radiation, heat lamps, resistive coils, etc. Also, any conventional device may be utilized to mist or atomize the solution. The inventive method also includes the method of spraying the solution into a mist form that is then passed through a heated zone so as to vaporize the mist prior to reaching the substrate, as illustrated in FIG. 5 by heating elements 28.

It should also be understood that different lithium and cobalt compounds or chelates compounds may be utilized in the inventive method preferably those which can be volatilized below 300° C. However, it is believed that the recited compounds provide the critical advantage of the capability of being handled in air.

Lastly, it should be understood that preferably only the first region R1 is utilized as the cathode of a battery. It is believed that through a proper arrangement of multiple nozzles the first region R1 may be optimized in size while the second and third regions R2 and R3 minimized or altogether eliminated.

It thus is seen that a high rate capability battery cathode is now provided which is manufacture without and extremely low pressure environment and without a nonreactive gas environment, yet still includes the proper crystal alignment without the need of post annealing. It should of course be understood that many modifications may be made to the specific preferred embodiment described herein without departure from the spirit and scope of the invention as set forth in the following claims.

What is claimed is:

1. A method of producing a lithium intercalation material cathode layer of a thin film battery comprising the steps of:
    (a) providing a lithium based solution;
    (b) atomizing the lithium based solution to form a mist;
    (c) heating the lithium based solution mist to a vapor state; and
    (d) depositing the vapor upon a substrate.

2. The method of claim 1 further comprising the step of (e) heating the substrate.

3. The method of claim 1 wherein the vapor is deposited through a nozzle.

4. The method of claim 3 wherein the mist is vaporized prior to passing through the nozzle.

5. The method of claim 3 wherein the mist is vaporized after passing through the nozzle.

6. The method of claim 1 wherein said lithium based solution is a lithium compound and cobalt compound dissolved within an organic solvent.

7. The method of claim 6 wherein said lithium compound is lithium (2,2,6,6-tetramethyl-3,5-heptadionate).

8. The method of claim 6 wherein said cobalt compound is cobalt (III) acety lacetonate.

9. The method of claim 6 wherein the organic solvent includes diglyme.

10. The method of claim 6 wherein the organic solvent includes toluene.

11. The method of claim 6 wherein the organic solvent includes (2,2,6,6-tetramethyl-3,5-heptadionate).

12. The method of claim 6 wherein the organic solvent is a mixture of diglyme, toluene and (2,2,6,6-tetramethyl-3,5-heptadionate).

13. The method of claim 1 wherein the mist has a droplet size distribution of between 5 and 20 micrometers.

14. A method of producing a layer of lithium metal oxide comprising the steps of:
    (a) providing a solution having a mixture of lithium (2,2,6,6-tetramethyl-3,5-heptadionate) and cobalt (III) acetyl lacetonate dissolved in an organic solvent;
    (b) processing the solution to form a mist;
    (c) heating the solution mist to a vapor state; and
    (d) depositing the vapor upon a substrate.

15. The method of claim 14 further comprising the step of (e) heating the substrate.

16. The method of claim 14 wherein the vapor is deposited through a nozzle.

17. The method of claim 16 wherein the mist is vaporized prior to passing through the nozzle.

18. The method of claim 16 wherein the mist is vaporized after passing through the nozzle.

19. The method of claim 14 wherein the organic solvent includes diglyme.

20. The method of claim 14 wherein the organic solvent includes toluene.

21. The method of claim 14 wherein the organic solvent includes (2,2,6,6-tetramethyl-3,5-heptadionate).

22. The method of claim 14 wherein the organic solvent is a mixture of diglyme, toluene and (2,2,6,6-tetramethyl-3,5-heptadionate).

23. The method of claim 14 wherein the mist has a droplet size distribution of between 5 and 20 micrometers.

* * * * *